(12) United States Patent
Chuang

(10) Patent No.: US 6,182,486 B1
(45) Date of Patent: Feb. 6, 2001

(54) SUPERPLASTIC ALLOY-CONTAINING CONDUCTIVE PLASTIC ARTICLE FOR SHIELDING ELECTROMAGNETIC INTERFERENCE AND PROCESS FOR MANUFACTURING THE SAME

(75) Inventor: Tung-Han Chuang, Taipei (TW)

(73) Assignee: National Science Council, Taipei (TW)

( * ) Notice: Under 35 U.S.C. 154(b), the term of this patent shall be extended for 0 days.

(21) Appl. No.: 09/095,785

(22) Filed: Jun. 11, 1998

(30) Foreign Application Priority Data

Dec. 30, 1997 (TW) .................................................. 86120019

(51) Int. Cl.⁷ .............................. B21B 1/46; B65D 90/04; B21D 26/02
(52) U.S. Cl. ...................... 72/46; 72/60; 72/58; 72/709; 29/527.1; 29/527.4; 29/421.1; 264/510
(58) Field of Search .................................. 72/46, 58, 59, 72/60, 709; 29/527.1, 527.2, 527.4, 421.1; 264/255, 259, 510

(56) References Cited

U.S. PATENT DOCUMENTS

| | | | |
|---|---|---|---|
| 4,450,977 | * 5/1984 | Colburn et al. | ............................ 72/46 |
| 4,474,685 | 10/1984 | Annis . | |
| 5,055,143 | * 10/1991 | Runyan et al. | .......................... 72/709 |
| 5,193,265 | * 3/1993 | Muggli et al. | ........................ 29/527.4 |
| 5,531,851 | 7/1996 | Lin et al. . | |
| 6,029,269 | * 2/2000 | El-Soudani | .............................. 72/709 |

FOREIGN PATENT DOCUMENTS

| | | | |
|---|---|---|---|
| 60-112854 | 6/1985 | (JP) . | |
| 61-293827 | 12/1986 | (JP) . | |
| 3-204125 | * 9/1991 | (JP) | ....................................... 72/709 |
| 4-75723 | * 3/1992 | (JP) | ....................................... 72/709 |

\* cited by examiner

*Primary Examiner*—David Jones
(74) *Attorney, Agent, or Firm*—Clark & Elbing LLP

(57) ABSTRACT

The present invention provides a superplastic alloy-containing conductive plastic article for shielding electromagnetic interference. The conductive plastic article is a three-layer structure, in which the outer layers are plastic material, and the inner layer is a superplastic alloy. The requirements for the raw materials are that the melting point of the superplastic alloy is higher than the softening point of the plastic, and the superplastic alloy has superplasticity at a temperature higher than the softening point of the plastic. The conductive plastic article can be manufactured in one processing stage, has the same shielding effectiveness as that of a conventional metal plate article, and can take a delicate and complicated form as that of a conventional plastic article. Moreover, the superplastic alloy contained therein has a uniform thickness and good adherence to plastic.

19 Claims, 12 Drawing Sheets

SUPERPLASTIC ALLOY-CONTAINING CONDUCTIVE PLASTIC ARTICLE FOR SHIELDING ELECTROMAGNETIC INTERFERENCE AND PROCESS FOR MANUFACTURING THE SAME

BACKGROUND OF THE INVENTION

1. Field of the Invention

The present invention relates to a superplastic alloy-containing conductive plastic article for shielding against electromagnetic interference (EMI), and more particularly relates to a process for manufacturing a conductive plastic article containing one continuous superplastic alloy layer in one processing stage.

2. Description of the Prior Art

In recent years, progress in technology has led to an extensive increase in the amount of sophisticated electronic equipment. However, the high-density electromagnetic waves produced from electronic equipment have the potential to damage or adversely affect the performance of other equipment or components. Also, exposure to electromagnetic waves is harmful to the human body. Therefore, an electrically conductive outer shell is needed to shield electromagnetic interference (EMI) produced from electronic equipment.

Heretofore, various methods have been used to shield electronic equipment. Metallic boxes and cans fabricated from steel, copper, aluminum, etc., were used to surround high EMI emitters as shielding. However, metallic shields with intricate shapes were difficult to be fabricated by the conventional metalworking methods. Moreover, metallic shields were cumbersome, heavy and costly. Therefore, the electronic industry has resorted to metallized plating on plastics. Unfortunately, the results obtained with metallic coatings were not always satisfactory. In addition to being relatively non-economical, once such metallic coatings were scratched through, they would lose part of their shielding efficiency. Unless such conductive coatings are continuous and free of voids, electromagnetic waves will be free to pass through. Frequently, it was difficult to obtain a dependable, 100% effective coating which was also resistant to peeling.

Further efforts by the electronics industry to develop more dependable light-weight materials for EMI shielding have led to a third approach, namely electrically conductive component-filled plastic composites. It was anticipated that intricate shapes could be molded from the composite materials by conventional means, yielding a finished part that promised to be more economic and dependable than metal or metal-coated plastics.

The principle factor influencing the performance of conductive component-filled plastic composites is the aspect ratio of the conductive fillers. The aspect ratio is defined as the ratio of the maximum dimension to the minimum dimension of the filler. For example, the aspect ratio of a fiber is the ratio of the length to the diameter of the fiber. According to the electromagnetic wave percolation theory, if the conductive filler in the plastic retains a higher aspect ratio, the filler easily forms a conductive network, thus, the critical concentration of the conductive filler required to achieve the electromagnetic shielding effect (that is, the threshold percolation concentration) is lower.

The methods for preparing conductive component-filled plastic composites can be classified into four types. The first type involves compounding the conductive fillers in the form of powders, short fibers or flakes with the plastic matrix, and then having the mixture hot-press molded or injection molded into various kinds of plastic products for shielding EMI.

For example, U.S. Pat. No. 4,474,685 discloses a process for fabricating electromagnetic shielding products by first compounding and then molding a composition including a thermosetting resin binder and an electrically conductive filler (including carbon black, graphite and conductive metal powders). However, during the compounding with the resin matrix, the conductive powders may easily cluster, and thus are not capable of dispersing in the resin matrix. Consequently, the electromagnetic shielding efficiency of the molded products can not be effectively improved. Furthermore, since the powder filler has a lower aspect ratio, according to the electromagnetic wave percolation theory as mentioned above, the amount (i.e., threshold percolation concentration) of the powder filler added must be relatively high to achieve electrical conductivity. Consequently, the mechanical properties, color and other physical and chemical properties of the molded products are adversely affected.

On the other hand, if the conductive filler is in a higher aspect ratio form such as fibers or flakes, the filler can be loaded to a lower level. However, the cluster phenomenon is still difficult to prevent. In addition, during the compounding process, in order to maintain the original aspect ratio, the conductive filler should be strong enough to prevent breakage due to compounding. However, such a strong conductive filler is very expensive, and is thus not suitable for ordinary low cost electronic equipment.

The second type of method for preparing conductive component-filled plastic composites involves binding a plastic layer to enclose the conductive continuous filler by immersion or extrusion, and then cutting the conductive long fiber-filled plastic stick to a predetermined length. For example, Japanese Patent No. 60-112854 discloses a process including continuous extruding thermoplastic plastic to enclose a copper fiber to form a copper fiber-filled plastic round stick, and then cutting the plastic round stick into pellets of a predetermined size. In order to increase the aspect ratio of the filler, the diameter of the conductive long fiber should be as small as possible. The fibrous filler must be strong enough to prevent breakage, but suitable fillers, such as stainless steel fiber, copper fiber or metal-coated carbon fiber, are very expensive.

To decrease the total cost of the production of conductive component-filled plastic composites, aluminum filler, which has the advantages of low price, low density, excellent electromagnetic shielding efficiency, and easy of color matching, has already been used. However, since aluminum has low strength, when aluminum material is utilized in the first method for preparing aluminum-filled plastic composites, the process involves compounding aluminum flakes with plastic. However, since aluminum has low strength, many aluminum flakes or fibers break during processing, resulting in a rapid decrease of the aspect ratio. Therefore, the incorporation amount (threshold percolation concentration) should be increased to a very high level (generally, as high as 30 to 40%) to achieve an acceptable electromagnetic shielding efficiency. The consequence is that the total cost is increased, and more seriously, the electromagnetic shielding plastic products obtained have poor mechanical properties. For example, elongation, tensile strength, bending strength and impact strength are all adversely affected. Also for the second method, the low strength of aluminum causes the rupture of continuous long fibers, which results in an interruption of the binding process.

In order to solve the above-mentioned problems, the inventor of the present invention with his coworker have disclosed a third type of process making metallized plastic pellets in U.S. Pat. No. 5,531,851, in which radially arrangedmetal is filled. The process involves sandwiching an electrically conductive metal foil in between two plastic films to form a metallized laminated plastic sheet; slicing the plastic sheet into plastic strips; radially arranging the metallized plastic strips into a die of an extruder to be wetted and bound by molten plastic into a metallized plastic bar; and finally cutting the plastic bar into metallized plastic pellets of a predetermined size.

In the third method, aluminum can be successfully filled in the plastic. In addition, since no conventional compounding step is needed, the breakage of aluminum can be prevented and a higher aspect ratio can be maintained. Also due to the employment of a wider material (aluminum foil) with is further reinforced with plastic, the interruption of binding process in the second method will not occur. However, the procedures and apparatus for manufacturing such radially arranged metal filled pellets are very complicated, and the resulting pellets must be subjected to hot-press molding or injection molding to obtain the final plastic product for shielding electromagnetic interference. The total apparatuses required are very expensive.

The above three methods involve subjecting the conductive pellets to hot-pressing or injection molding to obtain the final plastic article for shielding EMI. When injection molding is employed, in order to prevent lag and orientional phenomena from occurring to the metallic filler in the mold, the design of the mold is very critical and complicated, thus increasing costs. Moreover, if a very thin product is desired, such as the outer shell of a notebook computer, the design of the mold is difficult, or even impossible to achieve.

In addition, floating phenomenon in the final conductive plastic article can not be prevented. Therefore, surface coating on the final conductive plastic article is required, thereby increasing cost. Most importantly, according to the above three methods, the conductive filler in the plastic is not continuous. Therefore, the resulting electromagnetic shielding effectiveness is limited, and is far less than that of a conventional metal plate or a plastic plate coated with conductive metal.

Generally speaking, the shielding effectiveness of a conventional metal plate or a plastic plate coated with metal can reach 60 dB or more, which meets the requirement for various electric equipment in various countries (FCC for U.S.A. , VDE for Germany, VCCI for Japan, CSA for Canada, CISPR for Russia) . However, a plastic article containing discontinuous conductive filler obtained from the above three methods has a shielding effectiveness of only about 40 dB, which can meet the requirements of general personal computer or other simple electric equipment.

Nowadays, personal computers are usually equipped with CD-ROM, LSI, or other circuits of high density and high frequency. Therefore, in the future, it is anticipated that personal computers will require a higher shielding effectiveness, for example, 50 dB or more. Obviously, the plastic articles obtained from the above three methods will not meet the future needs.

The fourth type of method for preparing conductive component-filled plastic composites applies vacuum molding technique. Japanese Patent No. 61-293827 discloses such method, which involves introducing the molten lead/tin alloy having a low melting point into the space between two molten plastic layers; rolling it to form a plastic/metal/plastic laminated plate; and subjecting the plate to vacuum molding at a temperature higher than the melting point of the metal and the softening point of the plastic to form a predetermined shape. By employing this method, hot-pressed molding and injection molding can be omitted, and production costs can be reduced. The conductive filler inside the plastic is in a continuous form.

However, during the process for manufacturing the plastic/metal/plastic laminated plate in the fourth method, the molten metal and the plastic have different viscosity and strength. Therefore, the thickness ratio of the metal to plastic in the laminated plate is very difficult to control. More seriously, during the vacuum molding process, the metal is in the molten state. Thus it has no bonding to the two plastic plates, and thereby, separation of the laminated plate very easily occurs. Even if the separation does not occur, when the laminated plate is attached to the wall of the mold, the metal is in the molten state and is flowing. Thus, the metal liquid will accumulate at slots, holes or other concave sites of the mold, and the resulting product for shielding EMI will have defects and is even strongly distorted.

In addition, the metal used in the fourth method has a melting point lower than the softening point of the plastic. This indicates that the final product can only be applied to a temperature lower than the melting point of the metal. Therefore, when the electronic elements including the product obtained from the fourth method are operated and generate heat at some points, the plastic outer shell and the electronic elements will be destroyed in those areas, causing very severe adverse results.

SUMMARY OF THE INVENTION

An object of the present invention is to solve the above-mentioned problems and to provide an EMI shielding conductive plastic product, which has a metal layer of even thickness and good adherence to plastic. The conductive plastic product should also have the same shielding effectiveness as that of a conventional metal plate, but have a delicate and complicated form, which is difficult to achieve with a conventional metal.

The process for manufacturing such conductive plastic product is also provided.

To achieve the above object, the present invention provides a conductive plastic article for shielding electromagnetic interference with a novel structure. The conductive plastic article has three layers. The outer layers are plastic material, and the inner layer is a superplastic alloy. The major feature resides in that the melting point of the superplastic alloy is higher than the softening point of the plastic, and the superplastic alloy has superplasticity at a temperature higher than the softening point of the plastic.

According to the present invention, such a conductive plastic article for shielding electromagnetic interference is manufactured by superplastic blowing, which comprising the following sequential steps:

(a) coating the surface of a superplastic alloy plate with a coupling agent by immersion or spraying;

(b) sandwiching the coupling agent-coated superplastic alloy plate between plastic material to form a plastic/superplastic alloy/plastic composite plate or assembly structure;

(c) in a mold, cooling and fixing the edges of the plastic/superplastic alloy/plastic composite plate or assembly structure;

(d) as step (c) is being conducted, superplastically blowing the composite plate or assembly structure by blowing a gas at a superplastic temperature, such that the superplastic alloy is superplastically formed, and the whole composite plate or assembly structure is also formed by the superplastic forming of the superplastic alloy, to form a conductive plastic article for shielding electromagnetic interference, wherein the superplastic temperature is higher than the softening point of the plastic and lower than the melting point of the superplastic alloy, such that during superplastic forming at the superplastic temperature, the plastic is in the molten state, while the superplastic alloy is maintained in the solid state; and (e) removing the formed conductive plastic article for shielding electromagnetic interference from the mold, wherein the melting point of the superplastic alloy is higher than the softening point of the plastic, and the superplastic alloy has superplasticity at a temperature higher than the softening point of the plastic.

Further applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE PREFERRED EMBODIMENTS

Figure 1A:
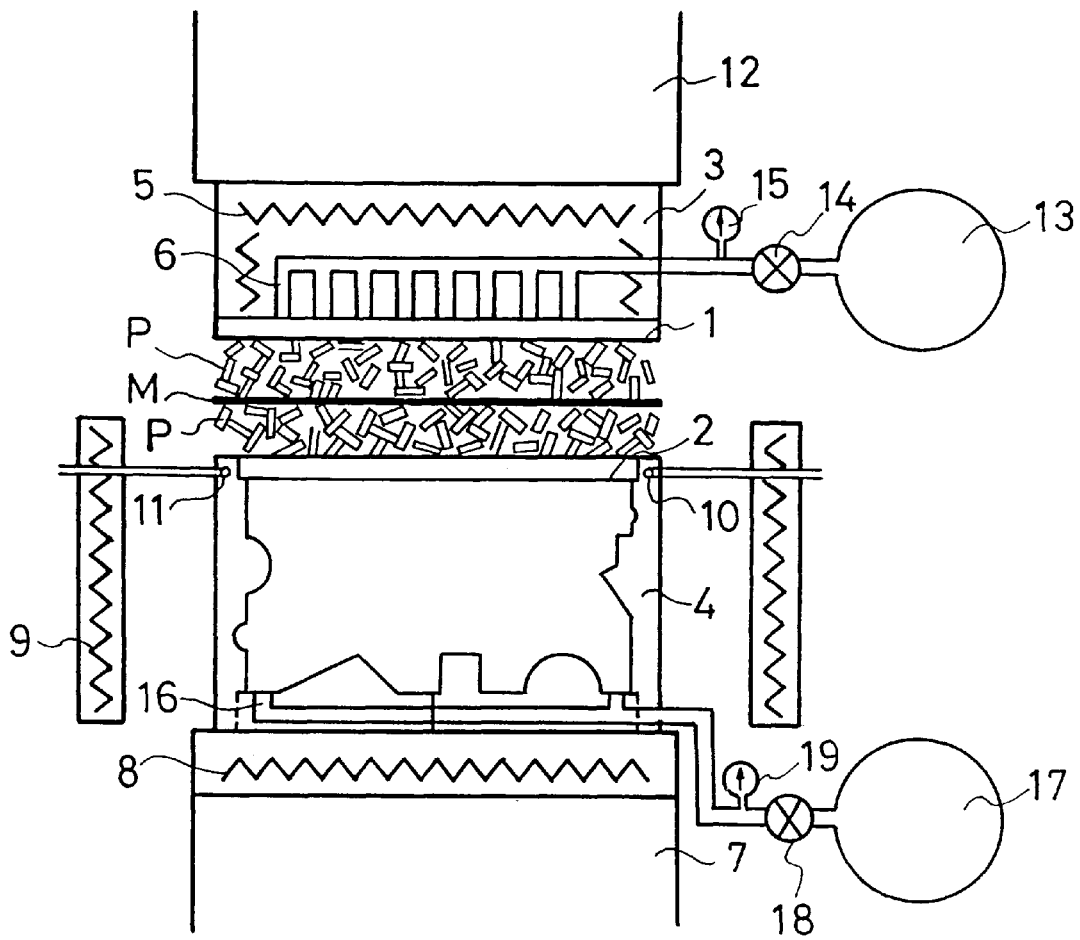
FIG. 1 shows a schematic diagram of the apparatus for manufacturing conductive plastic article for shielding electromagnetic interference according to the present invention, wherein in (a), the plastic material used is plastic particles, in (b), the plastic material used is a plastic plate, and in (c), there are no upper and lower pressing plates provided.

To solve the conventional problems, the inventor has successfully provided a conductive plastic article with a novel structure, and an improved process for manufacturing a conductive plastic article. According to the present invention, the most important feature resides in that a specific kind of superplastic alloy is used. The melting point of such superplastic alloy is higher than the softening point of the plastic, and the superplastic alloy has superplasticity at a temperature higher than the softening point of the plastic. In addition, the superplastic alloy has a lower electric resistivity.

According to the present invention, the process for manufacturing the conductive plastic article uses superplastic blowing technique. First, the surface of a superplastic alloy plate is coated with a coupling agent by immersion or spraying. Then, the coupling agent-coated superplastic alloy plate is sandwiched between plastic material to form a plastic/superplastic alloy/plastic composite plate or assembly structure. The composite plate or assembly structure is moved into a mold. The edges of the plastic/superplastic alloy/plastic composite plate or assembly structure are cooled and fixed, while at the same time, the composite plate or assembly structure is superplastically formed by blowing a gas at a superplastic temperature. In this manner, the superplastic alloy is superplastically formed and the whole composite plate or assembly structure is also formed by the superplastic forming of the superplastic alloy to form a conductive plastic article for shielding electromagnetic interference.

The superplastic temperature is set higher than the softening point of the plastic and lower than the melting point of the superplastic alloy, such that during superplastic forming at the superplastic temperature, the plastic is in the molten state, while the superplastic alloy is maintained as the solid state.

The so-called "superplastic alloy" is a specific alloy which undergoes very large deformations when a very low strain is applied under specific conditions. The requirements for a superplastic alloy include that: (1) the granule size of the superplastic alloy should be less than 10 $\mu$m; (2) the superplastic alloy is of two-phase structure; (3) the superplastic alloy is deformed at a temperature that is higher than half of the melting point of the superplastic alloy; and (4) the deformation rate is lower than $10^{-4}$ sec$^{-1}$, while some high rate superplastic alloys have been developed.

There are more than 200 kinds of superplastic alloys that have been reported or even commercialized. However, not all of superplastic alloys are suitable for the present invention.

Two mandatory conditions are required for the superplastic alloys suitable for use in the present invention.

(1) First, the superplastic alloy should have a melting point higher than the softening point of the plastic used. In this manner, the disadvantage encountered in the abovementioned fourth conventional process can be prevented.

(2) Second, the superplastic alloy used should have superplasticity at a temperature higher than the softening point of the plastic. Preferably, the superplastic temperature is very close to the softening point of the plastic. More preferably, the superplastic alloy has superplasticity at a temperature ranging from the softening point of the plastic to a temperature 100° C. higher than the softening point of the plastic. Thereby, when the superplastic alloy is deformed at the superplastic temperature, the plastic is melted. Thus, the molten plastic can be deformed by the superplastic forming of the superplastic alloy. Thus, the whole composite plate or assembly structure can be deformed. Among all superplastic alloys, only 10% can meet such a requirement, such as Zn—Al alloys or magnesium-based alloys. The superplastic temperature range of Zn—22 wt. %Al eutectoid alloy (Zn—22Al) is between 20° C. and 300° C., and its preferable superplastic temperature range is between 200° C. and 270° C., which is very close to the softening point of a plastic. Furthermore, it is inexpensive. Therefore, Zn—22Al eutectoid alloy is a superplastic alloy very suitable for use in the present invention.

For practical needs, there are four other optional requirements for a superplastic alloy.

(1) The superplastic alloy used in the present invention may have a lower electric resistivity, thus, the shield effectiveness of the final conductive plastic product can be ensured. Preferably, the superplastic alloy has an electric resistivity less than $20\,\mu\Omega\cdot cm$, and more preferably less than $5\,\mu\Omega\cdot cm$.

(2) For environmental reasons, superplastic alloys containing cadmium or lead are not favorable.

(3) For economical reasons, superplastic alloys of low cost are more acceptable because of the decrease in the total production cost.

(4) Preferably, the superplastic alloy formed has better mechanical properties (such as strength, elastic coefficient, and impact strength) than those of the plastic material used. Thus, the superplastic alloy filler can not only impart electromagnetic shielding effect to the plastic article, but also reinforce the whole plastic article.

Specifically, to explain the requirements for choosing a suitable superplastic alloy, we list some plastics, superplastic alloys, their properties, and the forming conditions. Table 1 lists the physical and mechanical properties of some frequently used thermoplastics. Table 2 lists the properties of some superplastic alloys suitable for use in the present invention. Table 3 lists the suitable combination of the plastic and superplastic alloy, and the suitable forming temperature and pressure.

TABLE 1

Physical and Mechanical Properties of Some Plastics

| Physical and Mechanical Properties | ABS | PPO | PS | ABS/PC |
|---|---|---|---|---|
| Thermal Deformation Temp (° C.) | 90~108 | 180~204 | 65~96 | 120~124 |
| Softening point (° C.) | 120~160 | 300 | 120~165 | 220~240 |
| Forming Temp (° C.) (in general) | 200~220 | 270~300 | 210~250 | 230~270 |
| Volume Resistivity ($\mu\Omega\cdot cm$) | $6.9 \times 10^{22}$ | $2.0 \times 10^{23}$ | $>10^{22}$ | $2.9 \times 10^{23}$ |
| Density (g/cm$^3$) | 1.02~1.16 | 1.06~1.07 | 1.04~1.06 | 1.10~1.19 |
| Tensile Strength (kg/mm$^2$) | 3.8~4.5 | 4.9~6.9 | 3.5~6.3 | 4.5~5.3 |
| Elongation (%) | 13~35 | 14~50 | 1.0~2.5 | 40~86 |
| Flexural Strength (kg/mm$^2$) | 6.7~8.0 | 8.4~14 | 6.1~9.8 | 9.0~10.8 |
| Elastic Coefficient of Flexure (kg/mm$^2$) | 250 | 246 | 310 | 329 |
| Izod Impact Value (kg · cm/cm) | 13 | 9.5 | 0.7 | 19 |
| Coefficient of Linear Expansion ($10^{-5}$/° C.) | 6~8 | 5.2~6.6 | 6~8 | 5~7 |
| Cost (US$/kg) | 2.2 | 4.3 | 1.7 | 2.3 |

TABLE 2

The properties of Some Superplastic Alloys Suitable for Use in the Present Invention

| Properties | Alloy | | | | | | |
|---|---|---|---|---|---|---|---|
| | Zn—22Al | Zn—0.1Ni—0.04Mg | Sn—9.8Zn | Sn—38Pb | Mg—33Al | Mg—6Zn—0.5Zr (Zk60A) | Mg—6Al—1Zn (Az61A) |
| Melting Point or Liquid Line (° C.) | 420 | 422 | 198 | 183 | 437 | 525 | 575 |
| Superplastic Temperature Range (° C.) | 20–300 | 75–300 | 20–180 | 20–170 | 82–437 | 230–350 | 230–350 |
| Best Superplastic Temperature Range (° C.) | 200–275 | 100–250 | 120–180 | 80–170 | 300–400 | 270–310 | 270–310 |
| Strain Rate of the Best Superplasticity (sec$^{-1}$) | $10^{-3}$–$10^{-1}$ | $10^{-3}$–$10^{-1}$ | $10^{-3}$–$10^{-1}$ | $10^{-3}$–$10^{-1}$ | $10^{-3}$–$10^{-1}$ | $10^{-3}$–$10^{-1}$ | $10^{-3}$–$10^{-1}$ |
| Rheological Strain of the Best Superplasticity (kg/mm$^2$) | 0.2 | 0.4 | 0.1 | 0.1 | 0.1 | 0.6 | 0.7 |
| Elongation of the Best Superplasticity (%) | 2900 | 980 | 570 | 4850 | 2100 | 1700 | 1700 |
| Strain Sensitivity of Superplasticity (m value) | 0.7 | 0.51 | 0.5 | 0.7 | 0.8 | 0.52 | 0.64 |
| Electric Resistivity ($\mu\Omega\cdot cm$) | 3.4 | 6.2 | 10.8 | 14.7 | 3.1 | 4.6 | 4.2 |
| Density (g/cm$^3$) | 2.8 | 7.1 | 7.2 | 8.4 | 1.8 | 1.6 | 1.5 |
| Tensile Strength (kg/mm$^2$) | 26.5 | 24.3 | 4.7 | 4.4 | 20.7 | 28.4 | 27.2 |
| Yield Strength (kg/mm$^2$) | 22.5 | 20.4 | 3.2 | 2.5 | 17.5 | 26.3 | 25.4 |
| Room Temperature Elongation (%) | 20 | 17 | 36 | 78 | 22 | 19 | 21 |
| Elastic Coefficient (kg/mm$^2$) | 7300 | 6600 | 4400 | 4300 | 4100 | 4700 | 4500 |
| Impact Value (kg · m/cm$^2$) | 13.7 | 10.8 | 7.1 | 7.0 | 6.5 | 12.2 | 11.9 |
| Coefficient of Thermal Expansion ($10^{-6}$/° C.) | 24.2 | 30.8 | 20.4 | 23.9 | 26.1 | 28.2 | 26.5 |
| Environmental Pollution | None | None | None | Pb pollution | None | None | None |
| Cost (USD/kg) | 5.6 | 4.2 | 7.8 | 7.5 | 10.7 | 12.8 | 12.5 |

TABLE 3

Conditions Suitable for the Superplastic Alloys of the Present Invention

| Suitable Conditions | Alloy | | | | | | |
|---|---|---|---|---|---|---|---|
| | Zn—22Al | Zn—0.1Ni—0.04Mg | Sn—9.8Zn | Sn—38Pb | Mg—33Al | Mg—6Zn—0.5Zr (Zk60A) | Mg—6Al—1Zn (Az61A) |
| Plastic | ABS, PPO PS, ABS/PC | ABS, PPO, PS, ABS/PC | ABS,PS | ABS,PS | PPO, ABS/PC | PPO, ABS/PC | PPO, ABS/PC |
| Forming Temp (° C.) | 120~250 | 120~250 | 120~180 | 120~170 | 120~350 | 300~350 | 300~350 |
| Forming Pressure (kg/mm$^2$) | 0.02~0.4 | 0.05~0.7 | 0.02~0.2 | 0.02~0.2 | 0.1~0.7 | 0.2~1.0 | 0.2~1.0 |

According to the above-mentioned mandatory and optional requirements, the superplastic alloys suitable for use in the present invention include zinc-based alloys, magnesium-based alloys, tin-based alloys, and aluminum-based alloys.

Representative examples of zinc-based alloys include Zn-0.1Ni-0.04Mg, Zn-4.9Al eutectoid alloy, Zn-18Al, Zn-22Al eutectoid alloy, Zn-36Al, Zn-40Al, Zn-50Al, Zn-22Al-0.1Cu, Zn-22Al-4Cu, Zn-22Al-0.2Mn, etc. Representative examples of magnesium-based alloys include Mg-33.6Al eutectoid alloy, Mg-30.7Cd, Mg-6Zn-0.5Zr, Mg-6Al-1Zn, etc. Representative tin-based alloys include Sn-9.8Zn eutectoid alloy, Sn-2~6Sb, etc. Representative aluminum-based alloys include Al-7.6Ca eutectoid alloy, Al-53Ge eutectoid alloy, Al-4.6Mg-0.75Mn-0.2Fe-0.15Si, Al-33Cu eutectoid alloy, Al-6Zn-3Mg, etc. Among these superplastic alloys, zinc-based alloys are particularly suitable for use in the present invention. Zn-22Al alloy is the most suitable one, since it meets the mandatory and optional requirements mentioned above.

The coupling agents suitable for coating on the superplastic alloy include silanes, titantates, zirconates and aluminates.

The plastic material suitable for use in the present invention may be in the form of a plate or particles.

Preferably, the plastic material is a thermoplastic, such as acrylonitrile-butadiene-styrene (ABS), polystyrene (PS), polyphenylene oxide (PPO) and acrylonitrile-butadiene-styrene/polycarbonate (ABS/PC).

Figure 1B:
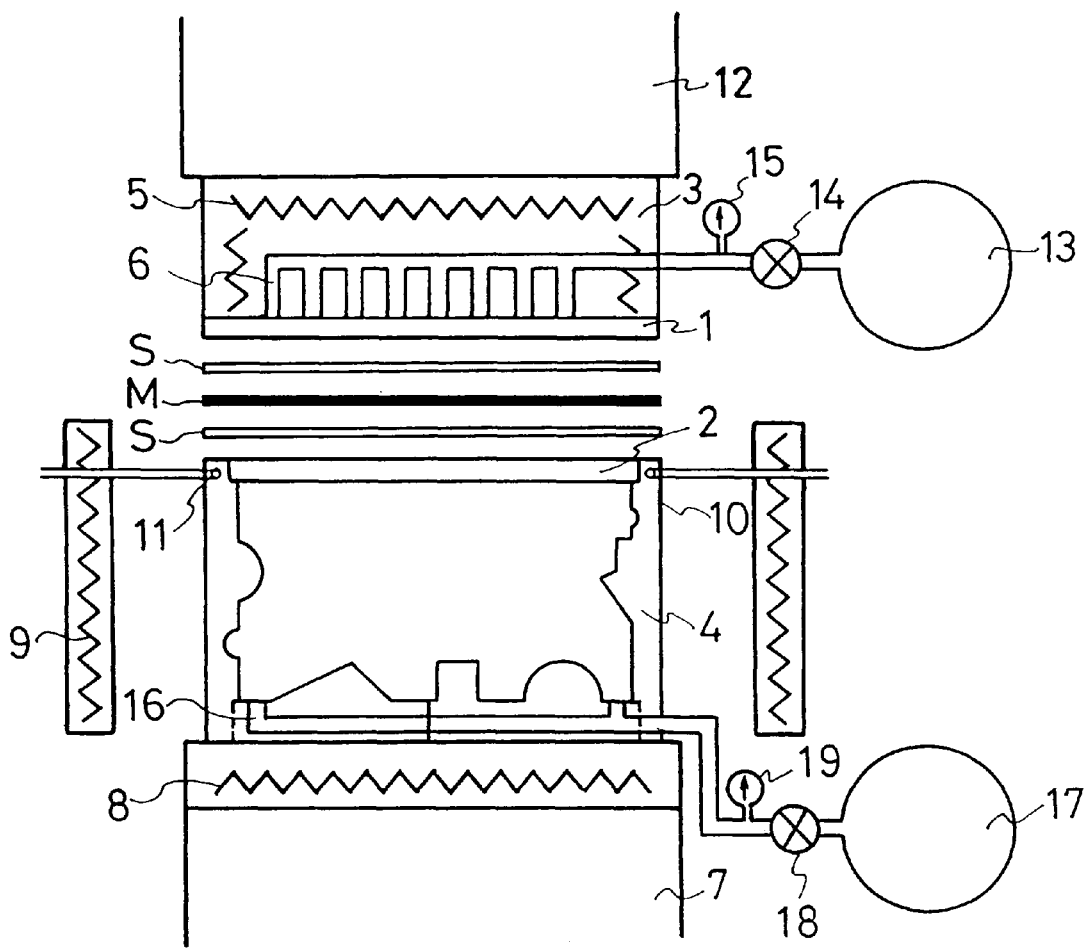
Figure 1C:
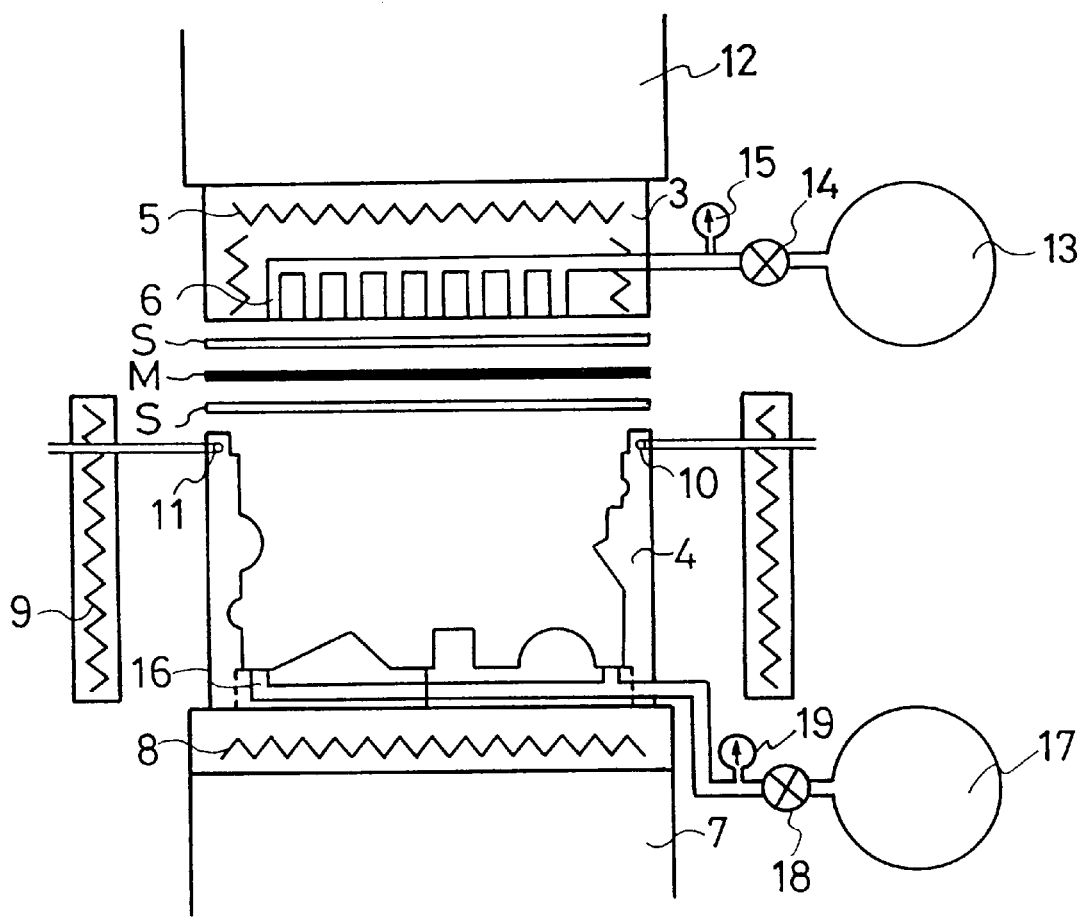

Referring now to FIG. 1, which shows a schematic diagram of the apparatus for manufacturing a conductive plastic article for shielding electromagnetic interference according to the present invention, the process for manufacturing the conductive plastic article will be described in more detail.

A superplastic alloy plate (M) is coated with a coupling agent by immersion or spraying. Then, the superplastic alloy plate (M) is sandwiched between a plastic material to form a plastic/superplastic alloy/plastic assembly structure. The plastic material can be in the form of particles (P) (see FIG. 1(a)) or a plate (S) (see FIG. 1(b)). The superplastic alloy used should meet the requirements that the melting point of the superplastic alloy is higher than the softening point of the plastic, and the superplastic alloy has superplasticity at a temperature higher than the softening point of the plastic. Preferably, the superplastic alloy has superplasticity at a temperature ranging from the softening point of the plastic to a temperature 100° C. higher than the softening point of the plastic. In addition, the superplastic alloy preferably has a thickness of less than 1.0 mm.

The assembly structure is then placed between an upper and lower pressingplates (1, 2) of a hot-pressing machine.

The upper pressing plate (1) is provided beneath a top mold (3), and the lower pressing plate (2) is provided on a bottom mold (4). The top mold (3) is provided with heating wires (5) and a vent line (6). The lower base (7) of the hot-pressing machine is provided with heating wires (8), and the bottom mold (4) is provided with heating wires (9) at its surroundings. The bottom mold (4) at its upper edges is provided with a cold water inlet (10) and a outlet (11), and is provided with a vent line (16) at its bottom.

Figure 2:
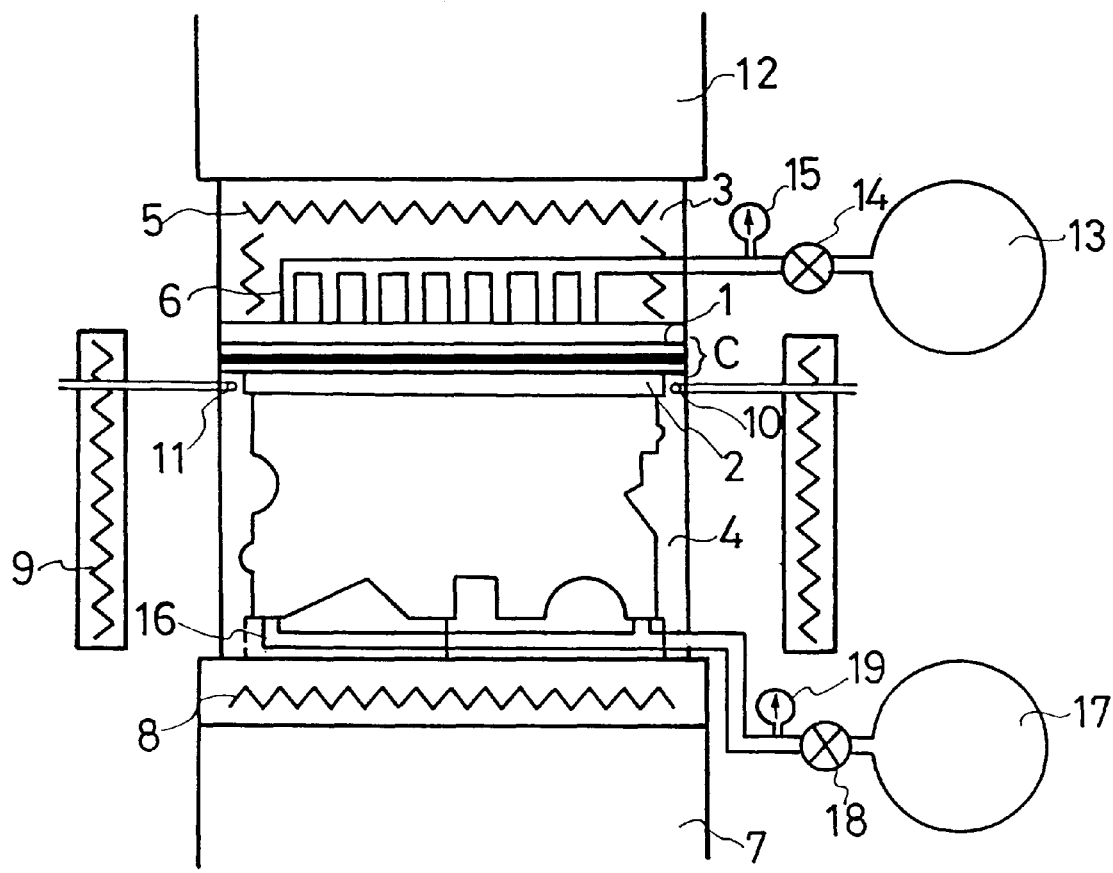
FIG. 2 is a schematic diagram showing that the plastic/superplastic alloy/plastic assembly structures in FIGS. 1a and 1b are hot-pressed into a composite plate according to the present invention. The assembly structure in FIG. 1C remains unbonded.

Subsequently, the heating wires are heated to a temperature between 120° C. and 350° C. to melt the plastic material. Referring to FIG. 2, the plastic/superplastic alloy/plastic assembly structure is pressed by an upper pressing base (12) of the hot-pressing machine into a composite plate (C). The hot-pressing temperature can be set higher than the softening point of the plastic and lower than the melting point of the superplastic alloy, such that the plastic is in the molten state, while the superplastic alloy is maintained in the solid state.

After the hot-pressing step, the upper pressing base (12) and the top mold (3) are lifted a little bit, and the upper pressing plate (1) and the lower pressing plate (2) of the hot-pressing machine are removed. Then, the upper pressing base (12) and the top mold (3) are pressed down again.

Figure 3:
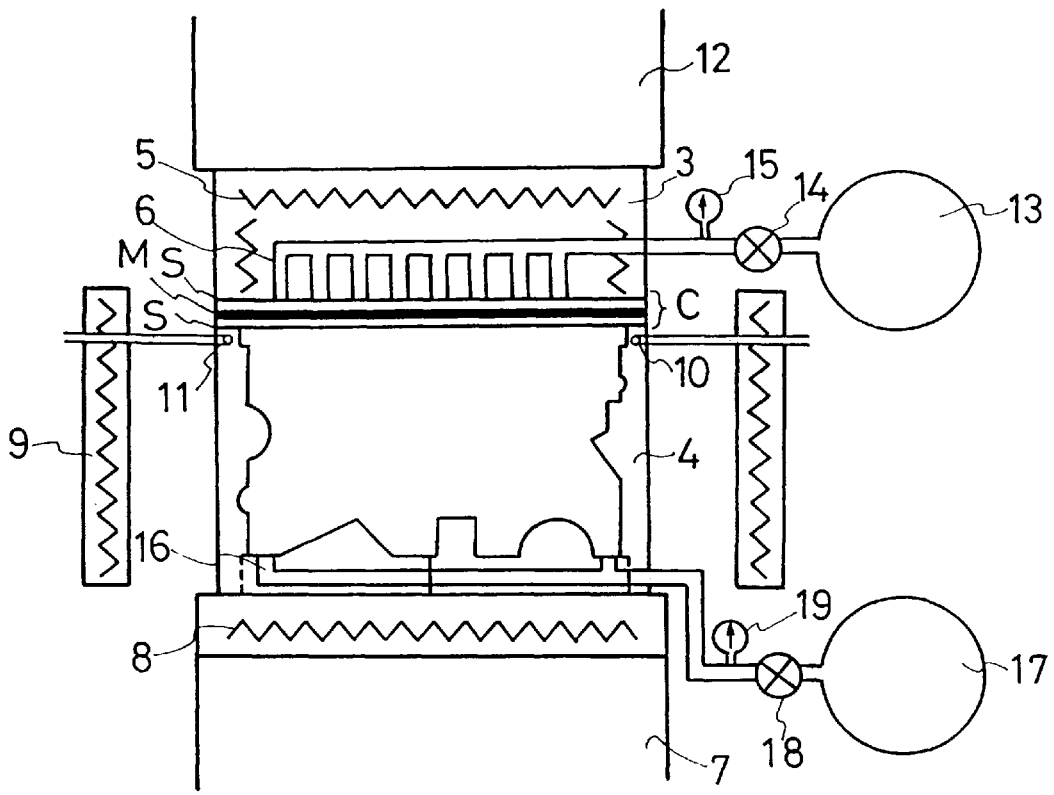
FIG. 3 is a schematic diagram showing that the plastic/superplastic alloy/plastic composite plate or assembly structure is ready for superplastic forming after the upper and lower pressing plates are removed and the edges of the composite plate or assembly are fixed.

The hot-pressing step can be omitted. That is to say, the upper and lower pressing plates (1, 2) are not necessary. In this case, the assembly structure (S/M/S) is directly placed between the top and bottom molds (3, 4) for further superplastic blowing, referring to FIG. 3.

Figure 4:
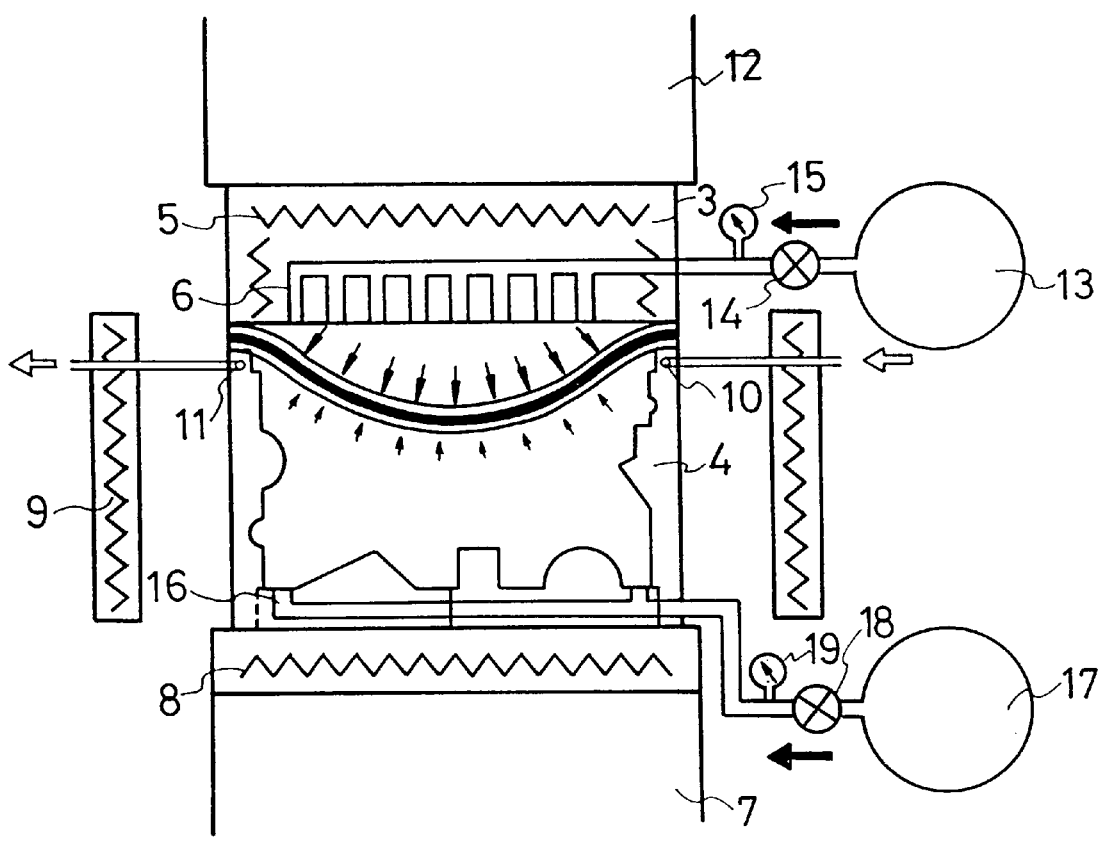
FIG. 4 shows the process of superplastic blowing for the plastic/superplastic alloy/plastic composite plate or assembly structure.

Referring to FIG. 4, the edges of the plastic/superplastic alloy/plastic composite plate or assembly structure (S/M/S) are then fixed between the top and bottom molds (3, 4) and cooled by flowing cold water from the cold water inlet (10) to the outlet (11). A positive pressure is introduced from an air pump (13) to the mold via the vent line (6), and the pressure is controlled by a pressure controlling valve (14) to 0.02 to 1.00 kg/mm$^2$. Simultaneously, a back pressure is introduced from another air pump (17) to the mold via the vent line (16), and the back pressure is controlled by another pressure controlling valve (18) to 0 to 0.50 kg/mm$^2$. The difference between the positive pressure and the back pressure is 0.02 to 1.00 kg/mm$^2$, which is the suitable forming pressure for the superplastic alloy used. The suitable forming pressure range is listed in Table 3. The back pressure can reinforce the adhesiveness of the plastic with the superplastic alloy.

Figure 5:
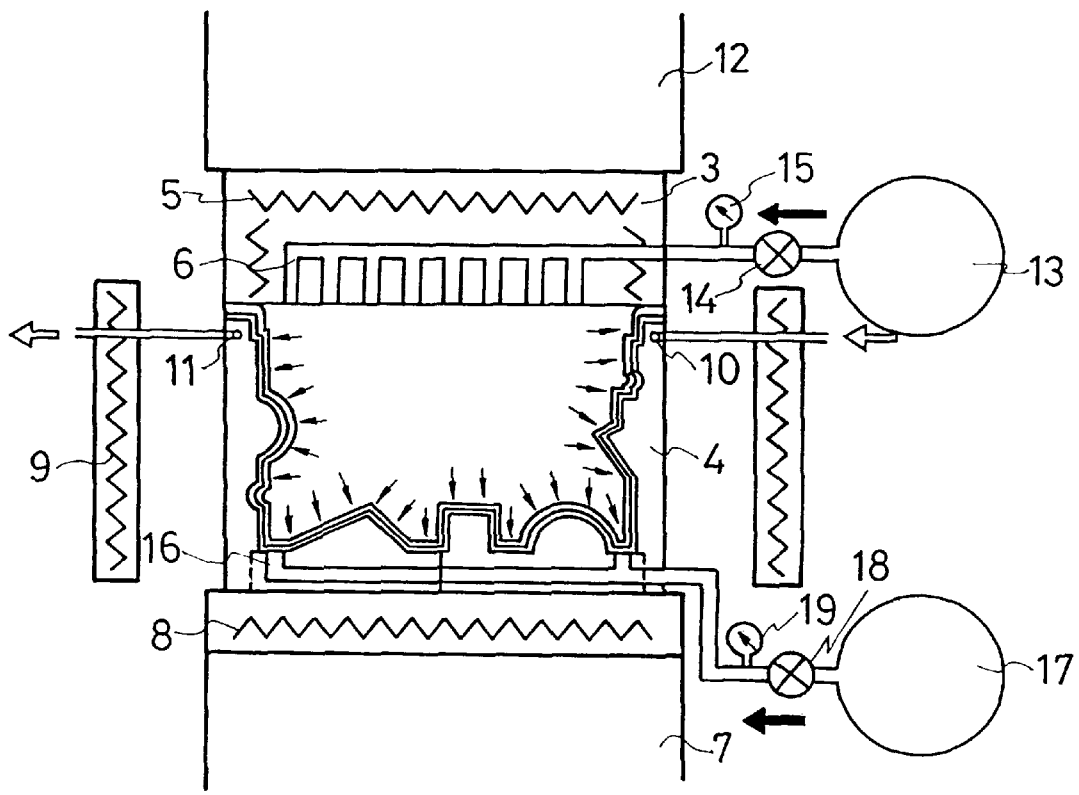
FIG. 5 shows the superplastically formed conductive plastic article.

The superplastic temperature can be set the same as the hot-pressing temperature, for example, at 120° C. to 350° C. At this temperature, the superplastic alloy plate will generate superplastic forming (see FIG. 4), while the plastic material is in a molten state. Since the strength of the molten plastic is far lower than that of the superplastic alloy, the deformation of the whole plastic/superplastic alloy/plastic composite plate (C) or the assembly structure (S/M/S) is almost totally controlled by the deformation of the superplastic alloy. FIG. 5 shows the superplastically formed conductive plastic article. During the superplastic blowing step, the plastic/superplastic alloy/plastic assembly structure (S/M/S) can also be simultaneously bonded into a composite plate (C).

Figure 6:
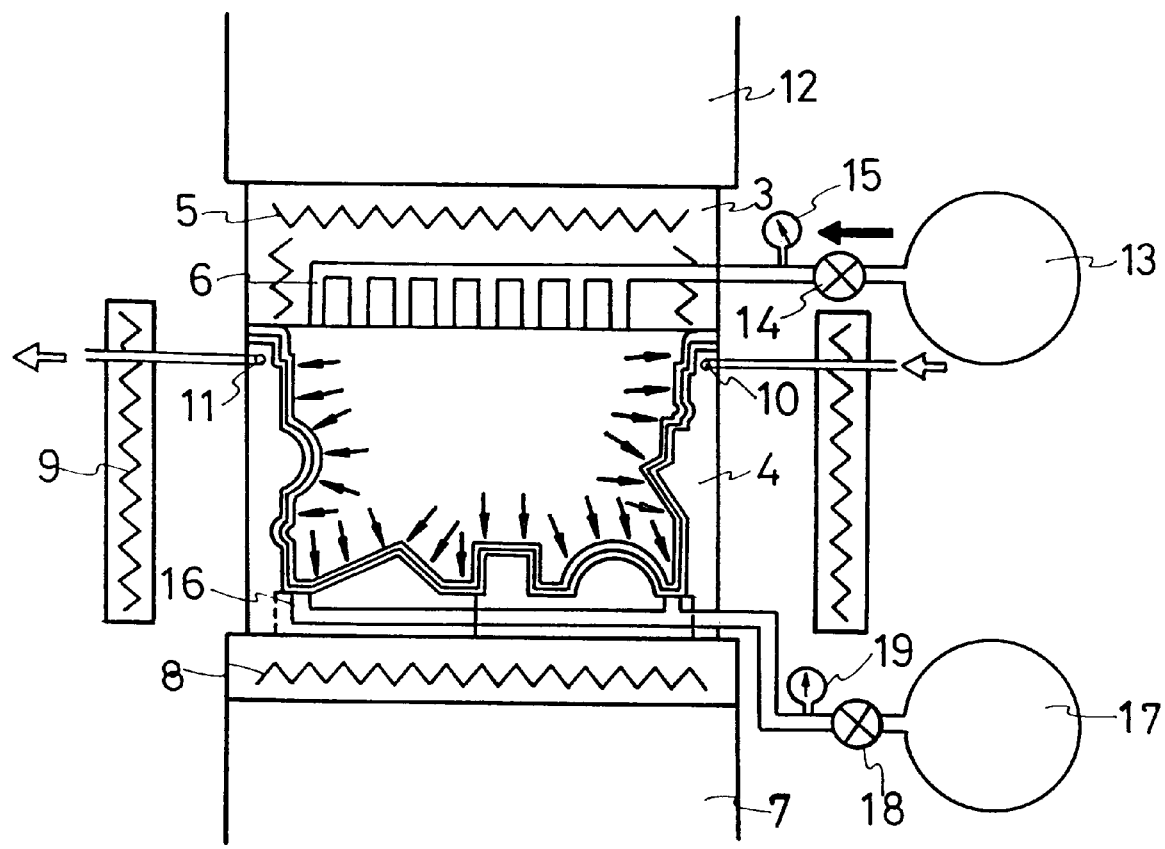
FIG. 6 shows that the pressure applied to the superplastically formed conductive plastic article is increased.
Figure 7:
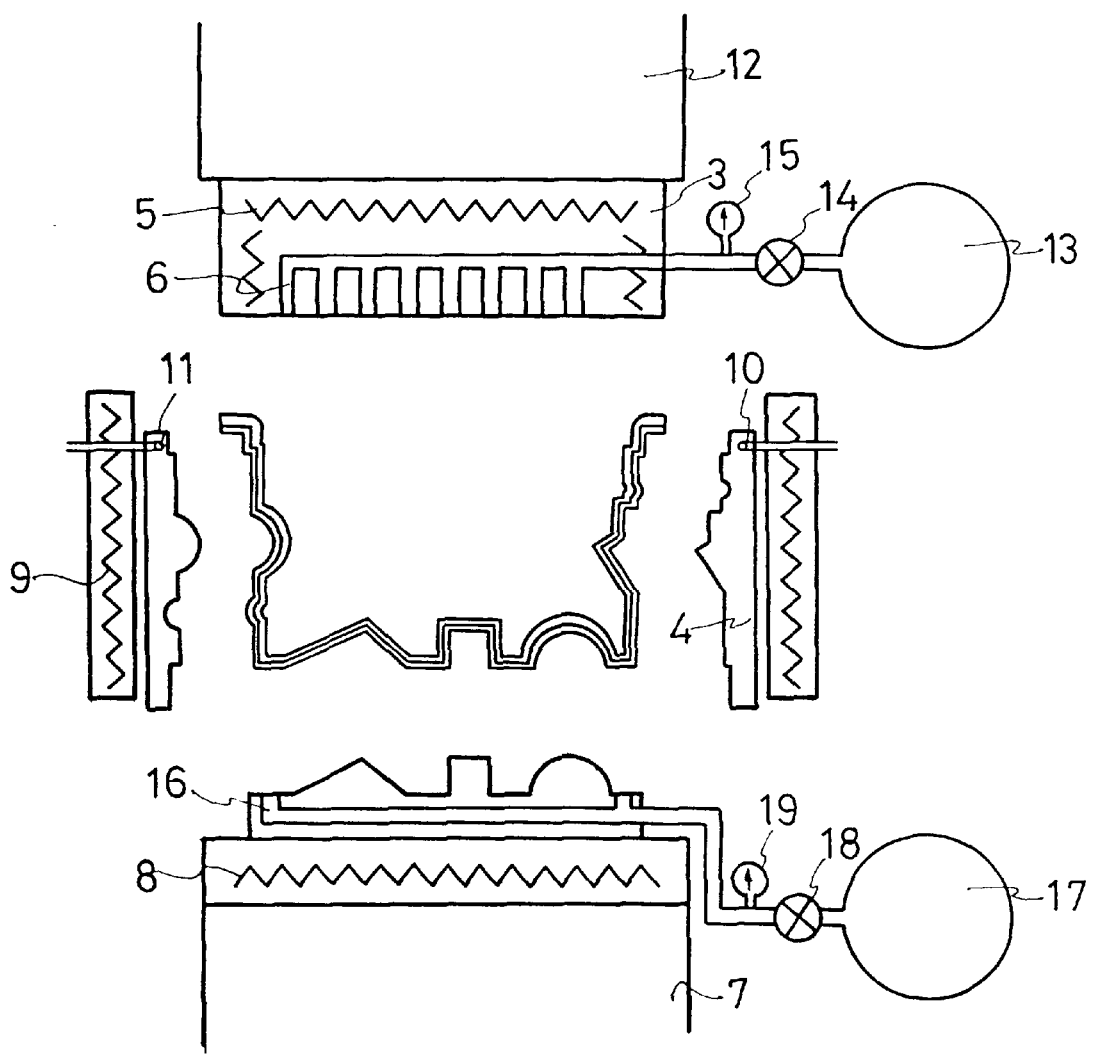
FIG. 7 shows that the conductive plastic article for shielding electromagnetic interference of the present invention is removed from the mold.

Referring to FIG. 6, when the superplastic blowing is completed, i.e., the composite plate is totally attached onto the shape of the bottom mold (4), the positive pressure is increased by 0 to 0.3 kg/mm$^2$, the back pressure is closed, and the temperature is kept at 120° C. to 350° C. This pressing step can be maintained for 0 to 10 minutes to increase the interface bonding between the plastic and superplastic alloy plate, and the thickness of the final plastic product can be more uniform. Similar to the hot-pressing step conducted prior to superplastic blowing, this pressing temperature can be set higher than the softening point of the plastic and lower than the melting point of the superplastic alloy, such that the plastic is in the molten state, while the superplastic alloy is maintained as the solid state.

Finally, after all of the procedures are completed, the positive pressure is closed, the bottom mold is opened to expose the work piece to room temperature. When the work piece is cooled to the point it will not deform, then the work piece (conductive plastic article for shielding EMI) is removed.

The following examples are intended to illustrate the process and the advantages of the present invention more fully without limiting its scope, since numerous modifications and variations will be apparent to those skilled in the art.

EXAMPLE 1

The process was conducted according to the above descriptions. A coupling agent (Silane A-187 manufactured by UNION CARBIDE Chemicals and Plastics Company) was mixed with ethanol to a 1 wt % solution. A Zn-22Al superplastic alloy plate of 0.5 mm was immersed in the coupling agent solution, thus, the coupling agent could be coated on the Zn-22Al plate. The pre-coated Zn-22Al plate was spread with ABS plastic particles on its upper and lower surfaces. The assembly structure was placed in the apparatus shown in FIG. 1(a) and was heated at 200° C. and pressurized at 0.21 kg/mm$^2$ to hot-press it into a ABS/Zn-22Al/ABS composite plate. Each resulting ABS layer has a thickness of about 0.5 mm.

Subsequently, at the same temperature, the composite plate was subjected to a positive air pressure of 0.21 kg/mm$^2$ and a back air pressure of 0.14 kg/mm$^2$ to conduct superplastic blowing. After 5 minutes, when the superplastic blowing was completed, and at the same temperature, the positive air pressure was increased to 0.35 kg/mm$^2$ and the back air pressure was closed. Such pressing was conducted for about 1 minute. Then, the mold was cooled to room temperature and the work piece was removed.

Figure 8A:
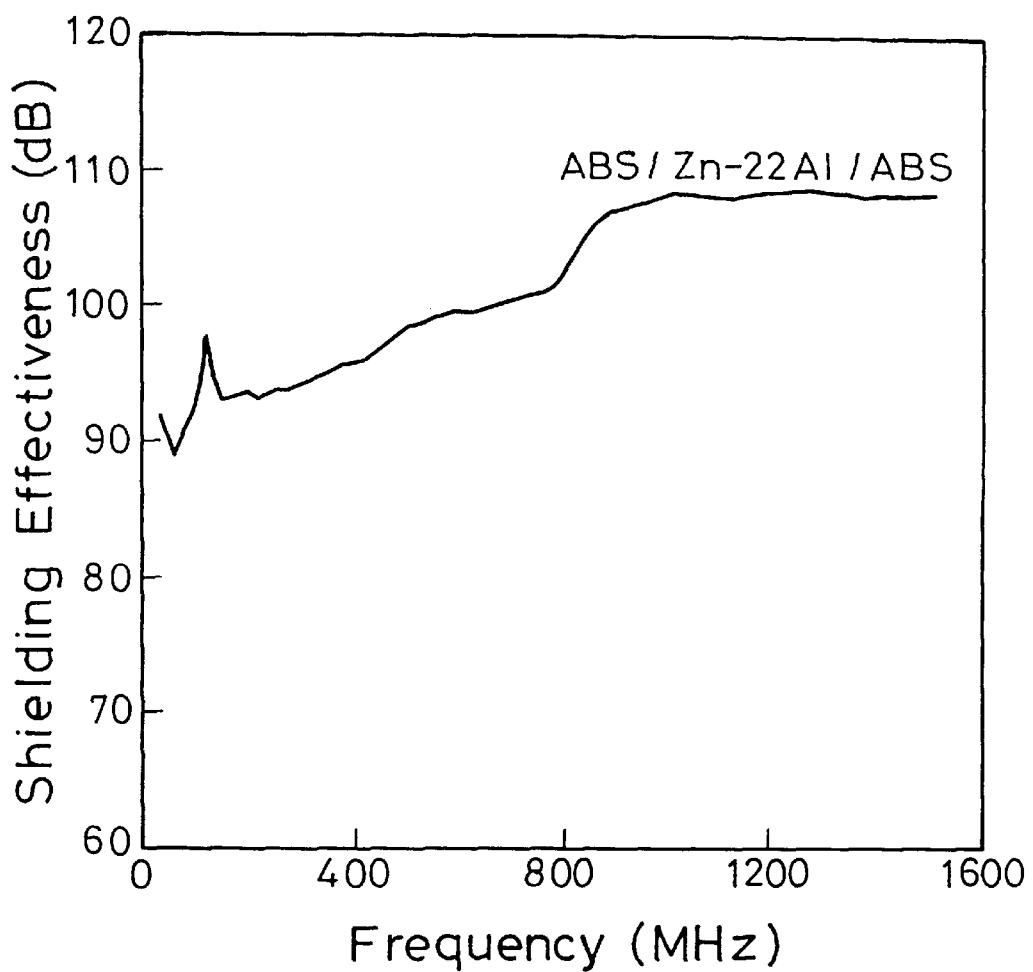
FIGS. 8(a), (b), and (c) show the shielding effectiveness of the conductive plastic articles of Examples 1, 2, and 3 of the present invention respectively.

The total thickness of the formed work piece was about 1 mm, and the Zn-22Al layer contained therein was about 0.3 mm. The shielding effectiveness of the work piece (conductive plastic article) is shown in FIG. 8(a), indicating that the formed work piece has good shielding effectiveness.

EXAMPLE 2

The process was conducted according to the above descriptions. A coupling agent (Silane A-187 manufactured by UNION CARBIDE Chemicals and Plastics Company) was mixed with ethanol to a 1 wt % solution. A Zn-22Al superplastic alloy plate of 0.3 mm was immersed in the coupling agent solution, thus, the coupling agent could be coated on the Zn-22Al plate. The pre-coated Zn-22Al plate was sandwiched between two composite plastic plates of 1.0 mm of ABS with 20 wt % PC. The three-layer assembly structure was placed in the apparatus shown in FIG. 1(b), and was heated at 200° C. and pressurized at 0.21 kg/mm$^2$ to hot-press it into a plastic/Zn-22Al/plastic composite plate.

Subsequently, at the same temperature, the composite plate was subjected to a positive air pressure of 0.21 kg/mm$^2$ and a back air pressure of 0.14 kg/mm$^2$ to conduct superplastic blowing. After 5 minutes, when the superplastic blowing was completed, and at the same temperature, the positive air pressure was increased to 0.05 kg/mm$^2$ and the back air pressure was closed. Such hot-pressing was conducted for about 1 minute. Then, the mold was cooled to room temperature and the work piece was removed.

Figure 8B:
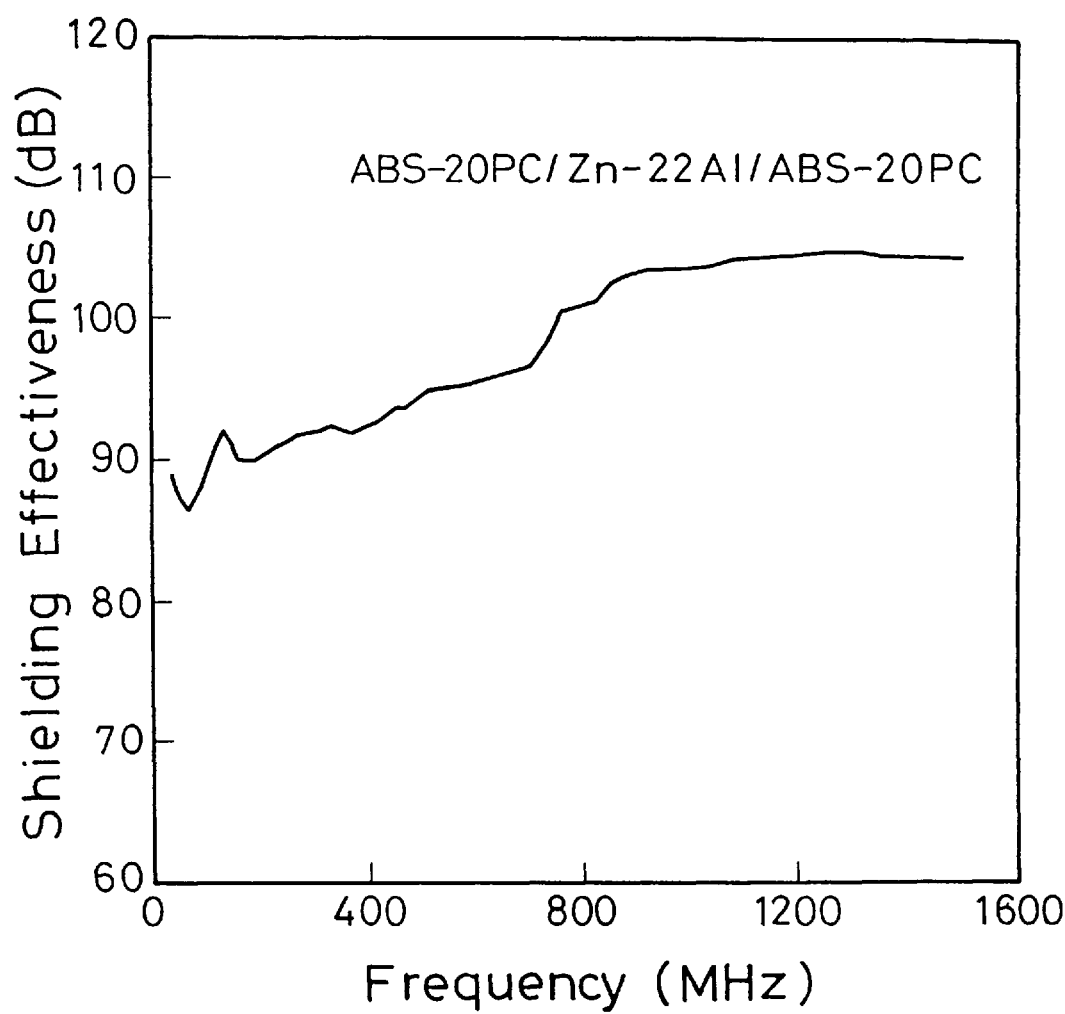

The total thickness of the formed work piece was about 0.5 mm, and the Zn-22Al layer contained therein was about 0.2 mm. The shielding effectiveness of the work piece (conductive plastic article) is shown in FIG. 8(b), indicating that the formed work piece has good shielding effectiveness.

EXAMPLE 3

The process was conducted according to the above descriptions. A coupling agent (Silane A-187 manufactured by UNION CARBIDE Chemicals and Plastics Company) was mixed with ethanol to a 1 wt % solution. A Zn-22Al superplastic alloy plate of 0.15 mm was immersed in the coupling agent solution, thus, the coupling agent could be coated on the Zn-22Al plate. The pre-coated Zn-22Al plate was sandwiched between two 0.45 mm of ABS plastic plates to form an assembly structure, while they were not hot-pressed into a composite plate.

Subsequently, the assembly structure was heated at 150° C., and directly applied with a positive air pressure of 0.02 kg/mm$^2$ to conduct superplastic blowing. After 5 minutes, when the superplastic blowing was completed, the mold was cooled to about 70° C. and the work piece was removed.

Figure 8C:
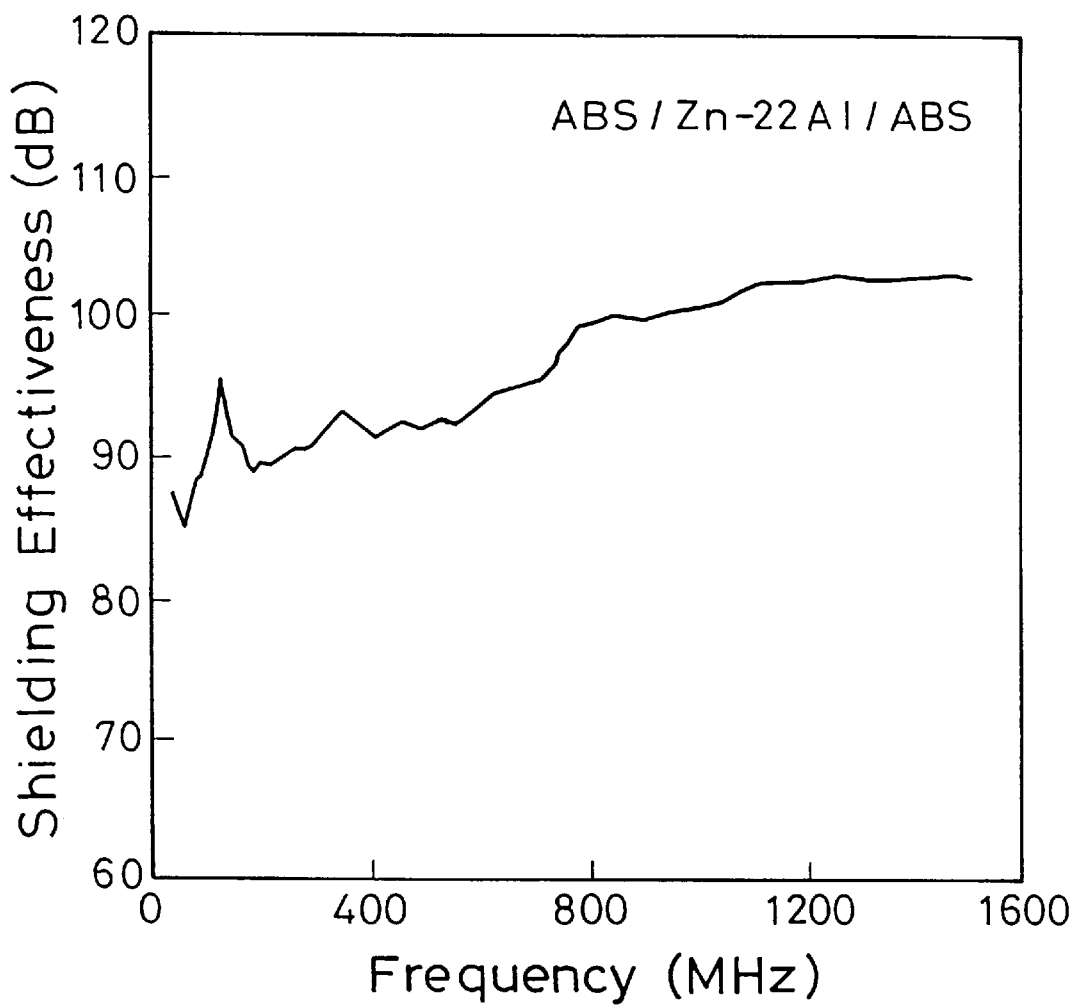

The total thickness of the formed work piece was about 0.5 mm, and the Zn-22Al layer contained therein was about 0.1 mm. The shielding effectiveness of the work piece (conductive plastic article) is shown in FIG. 8(c), indicating that the formed work piece has good shielding effectiveness.

The advantages of the present invention can be summarized as follows:

1. The raw materials including superplastic alloy plates, plastic particles and plates are commercialized and inexpensive.

2. No extrusion molding or injection molding machine is require, thus, the cost for total devices can be reduced.

3. During the superplastic blowing step, since the superplastic alloy is sandwiched between two layers of plastic, its oxidation can be prevented. Therefore, there is no need to use argon, which is used to protect superplastic alloy in conventional superplastic blowing for metal. In this case, an air compressor is used, which is much more inexpensive than the employment of argon gas. Thus, the cost for superplastic blowing can be significantly reduced.

4. In the resulting conductive plastic article of the present invention, the metal layer contained therein can be less than 0.1 mm. Therefore, the total metal incorporation amount of the article of the present invention required for achieving shielding effect is far less than that of the article obtained from conventional processes.

5. In the resulting conductive plastic article of the present invention, the superplastic alloy layer is completely sandwiched between two layers of plastic. Therefore, the article can have desired color, and its surface electric insulation and corrosion resistance will not be adversely affected.

6. In the resulting conductive plastic article of the present invention, the superplastic alloy layer is completely sandwiched between two layers of plastic. Therefore, in comparison with the plastic article coated with metal layers, short circuits due to the peeling off of conductive scraps can be prevented in the present invention.

7. In the resulting conductive plastic article of the present invention, the superplastic alloy contained can be less than 0.1 mm, therefore, the article is light in weight.

8. The superplastic alloy selected in the present invention has a melting point higher than the softening point of the plastic material. Therefore, during the whole manufacturing process, the whole plastic/superplastic alloy/plastic composite plate or assembly structure is formed by the superplastic forming of the superplastic alloy. Thus, the forming rate of the composite plate or assembly structure can be controlled by the temperature and gas pressure. In contrast, in the conventional fourth method for preparing conductive-filled plastic composites, the metal used has a lower melting point than the softening point of the plastic used. Therefore, in the whole process, the metal filler is always in its molten state, and the forming of the plastic/metal/plastic composite plate is very difficult to control. Moreover, the liquid metal will accumulate at slots, holes or other concave sites of the mold. Thus, the resulting product for shielding EMI will have defects and is even strongly distorted.

9. The superplastic alloy used has a higher melting point than the softening point of the plastic, therefore, the obtained article can be applied to a temperature up to the softening point of the plastic. Moreover, since there is a superplastic alloy layer which can prevent the plastic from deformation inside the plastic material, the conductive plastic article has even a higher heat resistance than conventional plastic articles.

10. The whole process of the present invention is conducted in one processing stage, thus reducing total cost. In contrast, the conventional process for manufacturing conductive articles involves subjecting the conductive plastic pellets to hot-pressing or injection molding, which requires two processing stages, thus wasting time and increasing cost.

11. After use, the conductive plastic article of the present invention can easily be recovered. Thus, no environmental problem will occur and the production cost can be reduced.

12. In recent years, as the strain rate of a superplastic alloy has improved continuously, the forming rate of such superplastic alloy has been enhanced. Therefore, the forming time required in the present invention can be shortened by enhancing the forming rate.

13. The conductive plastic article of the present invention contain a complete piece of continuous superplastic alloy layer. Therefore, the shielding effectiveness of the conductive plastic article of the present invention is equal to that of a metal plate, which is much better than that of the plastic article containing conductive material in the form of particles, flakes, or fibers.

14. By employing the superplastic blowing technique, the conductive plastic article can have as delicate and complicated a shape as a conventional plastic article can achieve. Therefore, delicate and complicated shape such as the outer shell of a computer or instrument can be successfully achievied.

15. In the resulting conductive plastic article of the present invention, the superplastic alloy layer can offer a reinforcement effect for the whole structure. Therefore, the wall of product can be thinner than that of a conventional plastic article. It is necessary for a portable elctronic product such as a notebook computer.

What is claimed is:

1. A superplastic blowing process for manufacturing a plastic article for shielding electromagnetic interference, comprising the following sequential steps:
   (a) coating the surface of a superplastic alloy plate with a coupling agent by immersion or spraying;
   (b) sandwiching the coupling agent-coated superplastic alloy plate between plastic material to form a plastic/superplastic alloy/plastic composite plate or assembly structure;
   (c) in a mold, cooling and fixing the edges of the plastic/superplastic alloy/plastic composite plate or assembly structure;
   (d) as step (c) is being conducted, superplastically blowing the composite plate or assembly structure by blowing a gas at a superplastic temperature, such that the superplastic alloy is superplastically formed, and the whole composite plate or assembly structure is also formed by the superplastic forming of the superplastic alloy, to form a conductive plastic article for shielding electromagnetic interference,
      wherein the superplastic temperature is higher than the softening point of the plastic and lower than the melting point of the superplastic alloy, such that during superplastic forming at the superplastic temperature, the plastic is in the molten state, while the superplastic alloy is maintained in the solid state; and
   (e) removing the formed conductive plastic article for shielding electromagnetic interference from the mold,
      wherein the melting point of the superplastic alloy is higher than the softening point of the plastic, and the superplastic alloy has superplasticity at a temperature higher than the softening point of the plastic.

2. The process as claimed in claim 1, further comprising step (b1), which is conducted after step (b):
   (b1) hot-pressing the plastic/superplastic alloy/plastic assembly structure to a plastic/superplastic alloy/plastic composite plate,
      wherein the hot-pressing temperature is higher than the softening point of the plastic and lower than the melting point of the superplastic alloy, such that the plastic is in the molten state while the superplastic alloy is maintained as the solid state.

3. The process as claimed in claim 2, wherein the hot-pressing temperature in step (b1) is the same as the superplastic temperature in step (d).

4. The process as claimed in claim 3, wherein the hot-pressing temperature in step (b1) and the superplastic temperature in step (d) are in the range from 120° C. to 350° C.

5. The process as claimed in claim 1, wherein in step (d), the gas is pressurized to conduct the superplastic blowing.

6. The process as claimed in claim 5, wherein the pressure of the pressurized gas is in the range from 0.02 to 1.00 kg/mm$^2$.

7. The process as claimed in claim 1, wherein in step (d), a positive pressure and a back pressure of the gas are provided to conduct superplastic blowing.

8. The process as claimed in claim 7, wherein the difference between the positive pressure and the back pressure is 0.02 to 1.00 kg/mm$^2$.

9. The process as claimed in claim 5, wherein the gas is the air.

10. The process as claimed in claim 1, further comprising step (d1), which is conducted after step (d):

(d1) pressing the superplastically formed conductive plastic article at a pressing temperature for 0 to 10 minutes, wherein the pressing temperature is higher than the softening point of the plastic and lower than the melting point of the superplastic alloy, such that the plastic is in the molten state, while the superplastic alloy is maintained as the solid state.

11. The process as claimed in claim 1, wherein the superplastic alloy has superplasticity at a temperature in the range from the softening point of the plastic to a temperature higher than the softening point of the plastic by 100° C.

12. The process as claimed in claim 1, wherein the superplastic alloy is selected from the group consisting of zinc-based alloys, magnesium-based alloys, tin-based alloys, and aluminum-based alloys.

13. The process as claimed in claim 12, wherein the superplastic alloy is a zinc-based alloy.

14. The process as claimed in claim 13, wherein the superplastic alloy is Zn-22 wt. %Al eutectoid alloy.

15. The process as claimed in claim 1, wherein the superplastic alloy plate has a thickness of less than 1.0 mm.

16. The process as claimed in claim 1, wherein the coupling agent is selected from the group consisting of silanes, titantates, zirconates and aluminates.

17. The process as claimed in claim 1, wherein the plastic material is in the form of a plate or particles.

18. The process as claimed in claim 1, wherein the plastic material is a thermoplastic.

19. The process as claimed in claim 18, wherein the plastic material is selected from the group consisting of acrylonitrile-butadiene-styrene (ABS), polystyrene (PS), polyphenylene oxide (PPO) and acrylonitrile-butadiene-styrene/polycarbonate (ABS/PC).

* * * * *